United States Patent [19]

Heath

[11] Patent Number: 5,955,976
[45] Date of Patent: Sep. 21, 1999

[54] DATA COMPRESSION FOR USE WITH A COMMUNICATIONS CHANNEL

[75] Inventor: Robert Jeff Heath, San Diego, Calif.

[73] Assignee: Hughes Electronics Corporation, El Segundo, Calif.

[21] Appl. No.: 08/982,864

[22] Filed: Dec. 2, 1997

[51] Int. Cl.$^6$ ..................................................... H03M 7/30
[52] U.S. Cl. ............................................... 341/87; 341/51
[58] Field of Search ......................................... 341/51, 87

[56] References Cited

U.S. PATENT DOCUMENTS

| | | | |
|---|---|---|---|
| 4,558,302 | 12/1985 | Welch | 340/347 |
| 4,862,167 | 8/1989 | Copeland, III | 341/107 |
| 4,929,946 | 5/1990 | O'Brien | 341/87 |
| 4,998,998 | 3/1991 | O'Brient | 341/55 |
| 5,463,390 | 10/1995 | Whiting et al. | 341/51 |

*Primary Examiner*—Howard L. Williams
*Assistant Examiner*—A. Tran
*Attorney, Agent, or Firm*—John T. Whelan; Michael W. Sales

[57] ABSTRACT

A method of compressing data involves receiving a symbol, and a subsequent symbol; determining in a compression dictionary whether the symbol has a valid extension pointer; using, in the event the symbol does have a valid extension pointer, the valid extension pointer to access string extension symbols; determining, in the event the symbol does have a valid extension pointer, whether the string extension symbols equal the at least one subsequent symbol; determining in the compression dictionary, in the event the string extension symbols do not equal the at least one subsequent symbol, whether the symbol has a valid parallel extension; repeating, in the event the symbol has a valid parallel extension, the using step; repeating, in the event the string extension symbols do not equal the at least one subsequent symbol, the determining of whether the symbol has a valid extension pointer; inserting, in the event the symbol does not have a valid extension pointer or in the event the symbol does not have a valid parallel extension, a code word indicative of a longest string found into a compressed data stream; determining whether the longest string was a single symbol; extending, in the event the longest string was a single symbol, the longest string by one symbol; extending, in the event the longest string was not a single symbol, the longest string by a plurality of symbols; inserting a string extension signalling code word if the string is extended by multiple symbols and transmitting the compressed data stream through the communications channel.

5 Claims, 9 Drawing Sheets

FIG. 1

| COMPRESSION DICTIONARY | | | | |
|---|---|---|---|---|
| | EXTENSION | PARALLEL | LOCATION | COUNT |
| 0h | INVALID | | | |
| 1h | INVALID | | | |
| ⋮ | ⋮ | FIRST 256 ENTRIES OF COMPRESSION DICTIONARY ONLY HAVE AN EXTENSION POINTER | | |
| A | INVALID | | | |
| B | INVALID | | | |
| C | 100h | | | |
| D | INVALID | | | |
| ⋮ | ⋮ | | | |
| 100h | 108h | INVALID | 1 | 0 |
| 101h | INVALID | INVALID | 2 | 0 |
| 102h | INVALID | INVALID | 3 | 0 |
| ⋮ | ⋮ | ⋮ | ⋮ | ⋮ |
| 106h | INVALID | INVALID | 7 | 0 |
| 107h | INVALID | INVALID | 8 | 0 |
| 108h | INVALID | INVALID | B | 5 |
| ⋮ | ⋮ | ⋮ | ⋮ | ⋮ |
| 3ffh | | | | |
| 100 | 102 | 104 | 106 | |

| DECOMPRESSION DICTIONARY | | |
|---|---|---|
| | LOCATION | DEPTH |
| 100h | 1 | 2 |
| 101h | 2 | 2 |
| 102h | 3 | 2 |
| ⋮ | ⋮ | ⋮ |
| 106h | 7 | 2 |
| 107h | 8 | 2 |
| 108h | 10h | 8 |
| ⋮ | ⋮ | ⋮ |
| 3ffh | | |

DATA COMPRESSION FOR USE WITH A COMMUNICATIONS CHANNEL

BACKGROUND OF THE INVENTION

The present invention relates to data compression (i.e., creation of compressed data from uncompressed data) and decompression (i.e., recovery of the uncompressed data from the compressed data).

Data compression systems are known in the prior art that compress a stream of digital data signals (uncompressed bits) into compressed digital data signals (compressed bits), which require less bandwidth (fewer bits) than the original digital data signals, and that decompress the compressed digital data signals back into the original data signals or a close approximation thereof. Lossless data compression systems decompress the compressed digital data signals back into the original data signals exactly. Thus, lossless data compression refers to any process that converts data into an alternative data form that requires less bandwidth, i.e., has fewer bits, than the data converted in a process that is reversible so that the original data can be recovered.

Accordingly, the objective of data compression systems is to effect a savings in an amount of storage required to hold the data or the amount of time (or bandwidth) required to transmit the data. By decreasing required space for data storage or required time (or bandwidth) for data transmission, data compression results in a monetary and resource savings.

A compression ratio is defined as the ratio of the length of the data in the alternative data form (compressed data) to the length of the data originally (original data). Thus defined, the smaller the compression ratio, the greater will be the savings in storage, time, or bandwidth.

If physical devices such as magnetic disks or magnetic tape are utilized to store the data, then a smaller space is required on the device for storing the compressed data than would be required for storing the original data, thereby, e.g., utilizing fewer disks or tapes for storage. If telephone lines, satellite links or other communications channels are utilized for transmitting digital information, then lower costs, i.e., shorter transmission times and/or smaller bandwidths, result when compressed data is employed instead of original data.

Data compression systems can be made particularly effective if the original data contains redundancies such as having symbols or strings of symbols appearing with high frequency. (In fact redundancies in the original data is a requirement for lossless data compression.) A data compression system operating on original data containing redundancies may, for example, transform multiple instances of a symbol, or transform a string of symbols, in the original data into a more concise form, such as a special symbol or group of symbols indicating multiple occurrences of the symbol, or indicating the string of symbols, and thereafter translate or decompress the concise form back into the multiple instances of the symbol, or back into the string of symbols.

For example, it may be desirable to transmit the contents of a daily newspaper via a satellite link or other communications link to a remote location for printing. Appropriate sensors within a data compression system may convert the contents of the newspaper into a data stream of serially occurring characters for transmission via the satellite link. If the millions of bits comprising the contents of the daily newspaper were compressed before transmission and decompressed at the receiver, a significant amount, e.g., such as 50% or more, of transmission time (or bandwidth) could be saved.

As a further example, when an extensive database such as an airline reservation database or a banking system database is stored for archival or backup purposes, a significant amount of storage space, such as 50% or more, can be saved if the database files are compressed prior to storage and decompressed when they are retrieved from storage.

To be of practical and general utility, a digital data compression system should satisfy certain criteria. Specifically, one criterion is that the system should provide high performance, i.e., compression/decompression rates, for both compression and decompression with respect to the data rates in the communications channel being utilized, be it a data bus, a wired network, a wireless network or the like. In other words, data transmission rates seen by a sender of uncompressed data and a receiver of the uncompressed data should not be reduced as a result of compression/decompression overhead. In fact, effective data rates achieved, may be significantly increased over slow communications channels, because more original data can be transmitted per unit time, if the original data is compressed preceding and following transmission, because there is less compressed data to transmit that there would have been original data.

The rate at which data can be compressed (i.e., the compression rate) is the rate at which the original data can be converted into compressed data typically specified in millions of bytes per second (megabytes/sec). The rate at which data can be decompressed (i.e., the decompression rate) is the rate at which compressed data can be converted back into original data. High compression rates and high decompression rates are necessary to maintain, i.e., not degrade, data rates achieved in present day disk, tape and communication systems, which typically exceed one megabyte/sec. Thus, practical data compression systems must typically have compression and decompression rates matching or exceeding some application-dependent threshold, e.g., one megabyte/sec.

The performance of prior art data compression systems is typically limited by the speed of the random access memories (RAM) and the like utilized to store statistical data and guide the compression and decompression processes. High performance compression rates and decompression rates for a data compression system can thus be characterized by a number of cycles (read and write operations) required per input character into or out of the data compression system. Fewer memory cycles per input character leads to higher performance compression rates and decompression rates.

Another important criterion in the design of a data compression and decompression system is compression effectiveness. Compression effectiveness is characterized by the compression ratio of the system, i.e. a smaller compression ratio indicates greater compression effectiveness. However, in order for data to be compressible using a lossless data compression system, the data to be compressed must contain redundancies. As a result, the compression ratio, or compression effectiveness, in a lossless data compression system (and to a lesser degree in a lossy data compression system) is a function of the degree of redundancy in the data being compressed. The compression effectiveness of any data compression system is also affected by how effectively the data compression system exploits, for data compression purposes, the particular forms of redundancy in the original data.

In typical computer stored data, e.g., arrays of integers, text, programs or the like, redundancy occurs both in the repetitive use of individual symbology, e.g., digits, bytes or characters, and in frequent recurrence of symbol sequences, such as common words, blank record fields, and the like. An effective data compression system should respond to both types of redundancy.

A further criterion important in the design of data compression and decompression systems is that of adaptability. Many prior art data compression procedures require prior knowledge, or the statistics, of the data being compressed. Some prior art procedures adapt to the statistics of the data as it is received, i.e., adaptive data compression systems, and others do not, i.e., non-adaptive data compressions systems. Where prior art procedures do not adapt to the statistics of the data as it is received, compression effectiveness is reduced, but where such procedures do adapt to the statistics, an inordinate degree of complexity is required in the data compression system. An adaptive data compression system may be utilized over a wide range of information types, which is typically the requirement in general purpose computer facilities while a non-adaptive data compression system operates optimally only on data types for which the non-adaptive data compression system is optimized. Thus, it is desirable that the data compression system achieves small compression ratios without prior knowledge of the data statistics, i.e., that the data compression system is adaptive. Many data compression systems currently available are generally not adaptable and so cannot be utilized to achieve small compression ratios over a wide range of data types.

General purpose data compression procedures are known in the prior art that either are or may be rendered adaptive, two relevant procedures being the Huffman method and the Tunstall method. The Huffman method is widely known and used, reference thereto being had in an article by D. A. Huffman entitled "A Method for the Construction of Minimum Redundancy Codes", *Proceedings IRE*, 40:10, pp. 1098–1100 (September 1952). Further reference to the Huffman procedure may be had in an article by R. Gallagher entitled "Variations on a Theme by Huffman", *IEEE Information Theory Transactions, IT*-24:6, (November 1978). Adaptive Huffman coding maps fixed length sequences of symbols into variable length binary words. Adaptive Huffman coding suffers from the limitation that it is not efficacious when redundancy exists in input symbol sequences which are longer than the fixed sequence length the procedure can interpret. In practical implementations of the Huffman procedure, the input sequence lengths rarely exceed 12 bits due to RAM costs and, therefore, the procedure generally does not achieve small compression ratios. Additionally, the adaptive Huffman procedure is complex and often requires an inordinately large number of memory cycles for each input symbol. Thus, the adaptive Huffman procedure tends to be undesirably cumbersome costly and slow thereby rendering the process unsuitable for most practical present day installations.

Reference to the Tunstall procedure may be had in the doctoral thesis of B. T. Tunstall entitled "Synthesis of Noiseless Compression Codes", *Georgia Institute of Technology*, (September 1967). The Tunstall procedure maps variable length input system sequences into fixed length binary output words. Although no adaptive version of the Tunstall procedure is described in the prior art, an adaptive version could be derived which, however, would be complex and unsuitable for high performance implementations. Neither the Huffman nor the Tunstall procedure has the ability to encode increasingly longer combinations of source symbols.

A further adaptive data compression system that overcomes some of the disadvantages of the prior art is that disclosed in U.S. Pat. No. 4,464,650 for APPARATUS AND METHOD FOR COMPRESSING DATA AND RESTORING THE COMPRESSED DATA, issued Aug. 7, 1984 to Cohen. The procedure of Cohen parses the stream of input data symbols into adaptively growing sequences of symbols. The procedure unfortunately, however, suffers from the disadvantages of requiring numerous RAM cycles per input character and utilizing time consuming and complex mathematical procedures such as multiplication and division to effect compression and decompression. These disadvantages tend to render the Cohen procedure unsuitable for numerous economical high performance implementations.

An even further adaptive data compression system that overcomes some of the disadvantages of the prior art is that disclosed in U.S. Pat. No. 4,558,302 for HIGH SPEED DATA COMPRESSION AND DECOMPRESSION APPARATUS AND METHOD, issued Dec. 10, 1985, to Welch. The procedure of Welch compresses an input stream of data symbols by storing, in a string table, strings of symbols encountered in an input stream. The Welch procedure next searches the input stream to determine the longest match to a stored string of symbols. Each stored string of symbols includes a prefix string and an extension character that is a last character in the string of symbols. The prefix string includes all but the extension character.

When a longest match between the input data stream and the stored strings of symbols is determined, the code signal for the longest match is transmitted as the compressed code signal for the encountered string of symbols and an extension character is stored in the string table. The prefix string of the extension character is the longest match, i.e., the longest stored string of symbols located in the search. The extension character of the extended string is the next input data character signal following the longest match.

Searching through the string table and entering extension characters into the string table is effected by a limited searching hashing procedure. Unfortunately, even the improved data compression system of Welch suffers from less than optimal compression effectiveness, and less than optimal performance. As a result, the Welch procedure, like the Cohen procedure, is unsuitable for many high performance implementations.

SUMMARY OF THE INVENTION

The present invention advantageously improves upon the above-described approaches by providing a lossless data compression (i.e., creation of compressed data from uncompressed data) and decompression (i.e., recovery of the uncompressed data from the compressed data) approach that improves on heretofore known data compression and decompression approaches.

In one embodiment, the invention can be characterized as a method of compressing data for transmission over a communications channel. The method involves receiving a symbol, and at least one subsequent symbol; determining in a compression dictionary whether the symbol has a valid extension pointer; using, in the event the symbol does have a valid extension pointer, the valid extension pointer to access string extension symbols; determining, in the event the symbol does have a valid extension pointer, whether the string extension symbols equal the at least one subsequent symbol; determining in the compression dictionary, in the event the string extension symbols do not equal the at least one subsequent symbol, whether the symbol has a valid parallel pointer; repeating, in the event the symbol has a valid parallel pointer, the using step; repeating, in the event the string extension symbols equal the at least one subsequent symbol, the determining of whether the symbol has a valid extension pointer; inserting, in the event the symbol does not have a valid extension pointer or in the event the symbol does not have a valid parallel pointer, a code word indicative of a longest string found into a compressed data stream; determining whether the longest string found was a single symbol; extending, in the event the longest string found was a single symbol, the longest string by one symbol; extending, in the event the longest string was not a single symbol, the longest string by one or more symbols; inserting, in the event the longest string found is extended by two or more symbols, a string extension signalling code word into the compressed data stream; and transmitting the compressed data stream through the communications channel.

In another embodiment, the invention can be characterized as a method for decompressing data received over a communications channel. The method has steps of receiving a code word; determining whether the code word represents a single character; placing, in the event the code word represents a single character, the code word into an output data stream; determining, in the event the code word represents more than a single character, whether the code word is in a dictionary; placing, in the event the code word is in the dictionary, a string defined by the code word into the output data stream; determining, in the event the code word is not in the dictionary, whether the code word is a next code word to be built; placing, in the event the code word is a next code word to be built, a string into the output data stream, the string being copied from a dictionary entry indicated by a previous code word processed; placing, in the event the code word is a next code word to be built, a first symbol of the string into the output data stream; and placing, in the event the code word is not in the dictionary and is not the next code word to be built, an extension string into the output data stream, the extension string being copied from the output data stream at a symbol following a last symbol of a dictionary entry indicated by a previous code word processed.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
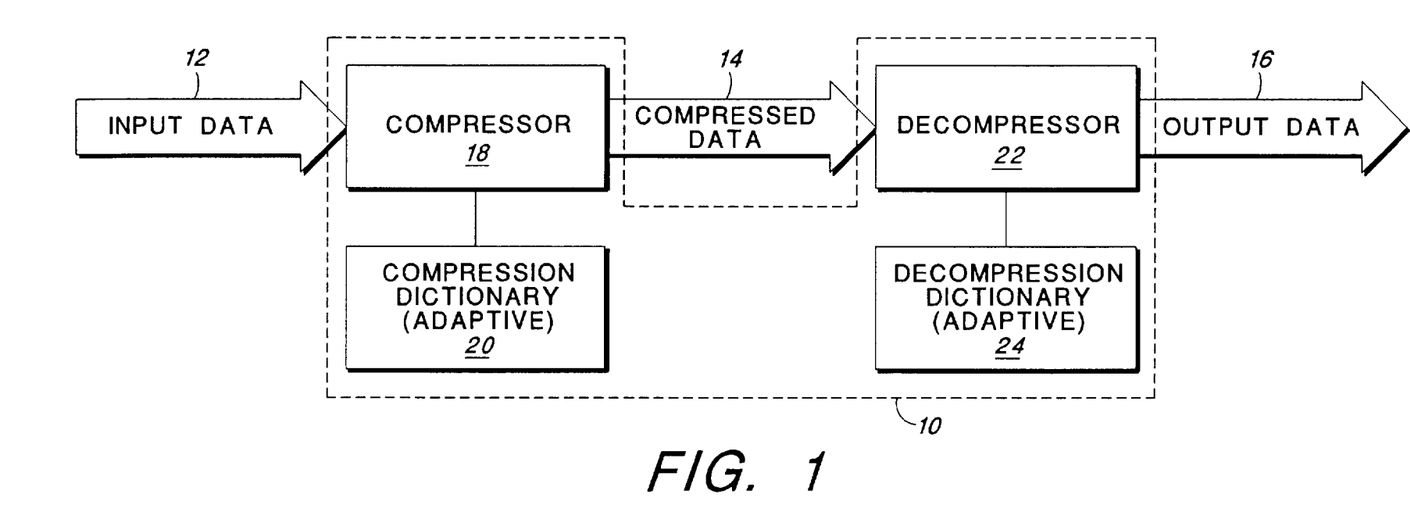
FIG. 1 is block diagram illustrating a data compression system in accordance with one embodiment of the present invention.

Referring to FIG. 1, a block diagram is shown of functional components of a data compression system in 10 combination with an input data stream 12, a data channel 14 and an output data stream 16, in accordance with one embodiment of the present invention. Shown is the input data stream 12, a compressor 18, a compression dictionary 20, the data channel 14 carrying compressed data, a decompressor 22, a decompression dictionary 24 and the output data stream 16. The compressor 18, the compression dictionary 20, the decompressor 22 and the decompression dictionary 24 together make up the data compression system 10. Advantageously, the data compression 10 system may be implemented using a general purpose computer or a special purpose computer (or other processor-and-memory-containing system, such as a satellite transmitter and receiver, cellular base station and cellular telephone, or the like) and appropriate software subsystems.

In accordance with the data compression system 10 of the present embodiment, the first, for example, 256 code words of, for example, 1024 possible assignable code words are reserved for 256 possible hexadecimal character code representations of an 8 bit byte character. For example, the first 256 code words may be assigned to extended ASCII (American Standard Code for Information Interchange) symbols, EBCDIC (Extended Binary Coded Decimal for Interchange Code) symbols, or the like. Thus, in accordance with the present embodiment, 768 code words, of the 1024 possible assignable code words, are available for assignment as dictionary entries to recurring strings of bytes (i.e., redundancies) built as character patterns are encountered within data to be compressed, i.e., during compression of the input data stream 12, or code words are processed within already compressed data, i.e., during decompression of the compressed data stream 14. These 768 code words are built and stored in the compression dictionary 20 during compression and built and stored in the decompression dictionary 24 during decompression.

The present embodiment stops building dictionary entries and extending strings when the 1024th code word is built, however, this is a matter of design choice and can be adapted to particular applications of the present embodiment. With particular sizes of data streams, optimal performance may be achievable by, for example, employing 2048, 4096 or more code words. The code words, however many, along with their assigned character bytes or recurring strings of bytes (or, more accurately, their assigned pointers to assigned character bytes or recurring strings of bytes within the input data stream 12) make up the compression dictionary 20, which is used to translate data to be compressed (original data, i.e., the input data stream) into compressed data (i.e., the compressed data stream), and the decompression dictionary 24, which is used to translate the compressed data back into the original data (i.e., the output data stream).

Figure 2:
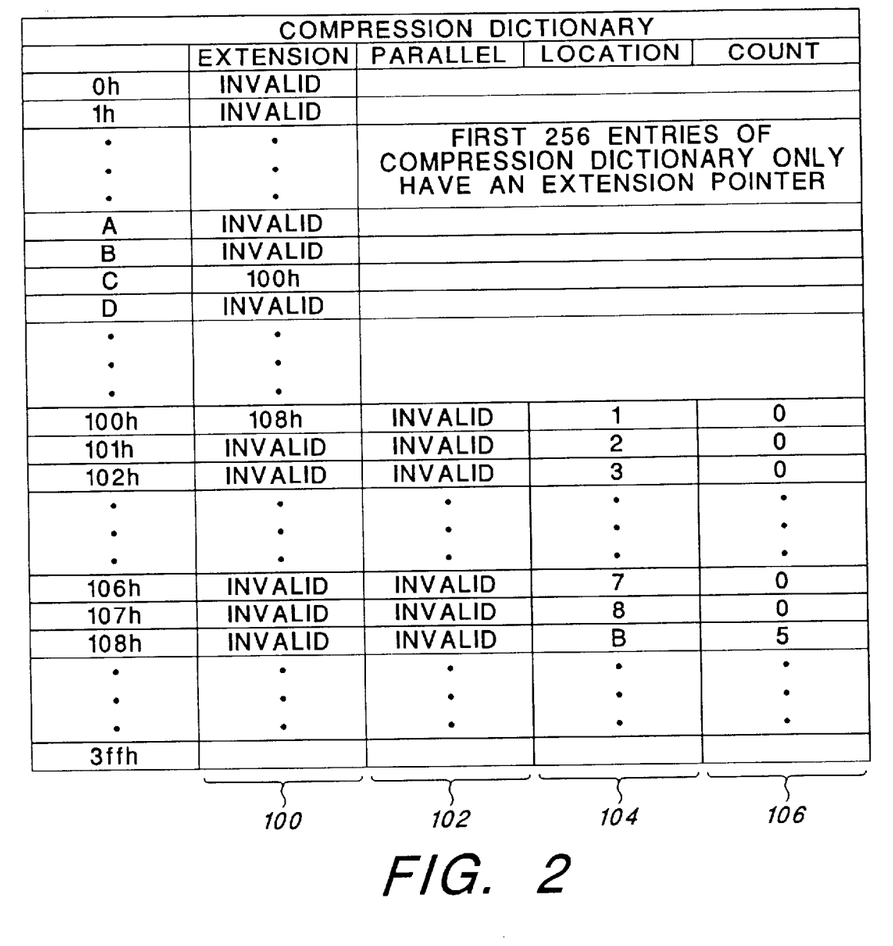
FIG. 2 is a tabular representation of a compression dictionary generated by the data compression system of FIG. 1.

The data compression system employs structure for the compression dictionary 20 that is different from the structure of the decompression dictionary 24. The compression dictionary 20 is defined according to the following elements illustrated in FIG. 2:

EXTENSION POINTER (100)—A pointer to a compression dictionary entry that defines an "extension string" to a current string. There are 1024 extension pointers each associated with a compression dictionary entry, and each compression dictionary entry is associated with a code word. The first 256 compression dictionary entries, which are associated with the first 256 code words, are reserved for the 256 hexadecimal representations of an 8 bit byte, and only have an extension pointer, i.e., they do not have a parallel pointer (see below). The remaining 768 compression dictionary entries, associated with the remaining 756 code words, have an extension pointer and a parallel pointer.

PARALLEL POINTER (102)—A pointer to a compression dictionary entry that defines an "extension string" to a previous string, a parallel string, i.e., a string that starts with the same character or characters as the current string and, thus, has the same previous string entry as the current string. There are 768 parallel pointers, associated with code words 256 through 1023.

LOCATION POINTER (104)—A pointer, into a previously compressed area of the input data stream, to a location of a first character of one or more extension characters of an extension string defined by a compression dictionary entry. There are 768 such pointers, for code words 256 through 1023.

COUNT (106)—A number of characters, in addition to the character pointed to by the location pointer, defined by a compression dictionary entry.

The compressor 18 initializes the compression dictionary 20 by placing an illegal pointer value into the EXTENSION POINTER (100) of the first 256 dictionary entries. These are the entries reserved for the 256 possible hexadecimal representations of an 8 bit byte. No other initialization is required.

Figure 3:
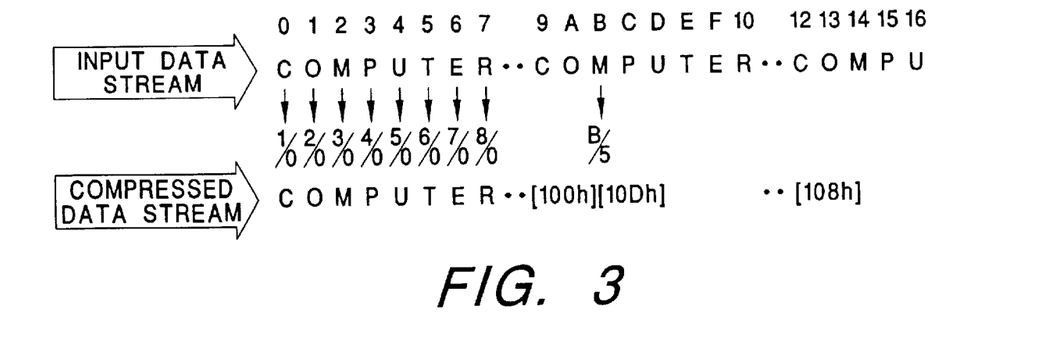
FIG. 3 is a tabular representation of exemplary input (or original) data suitable for compression with the data compression system of FIG. 1.

Referring to FIG. 3, an illustration is shown of an exemplary input data stream in response to which the compression dictionary in FIG. 2 is generated.

Figure 4:
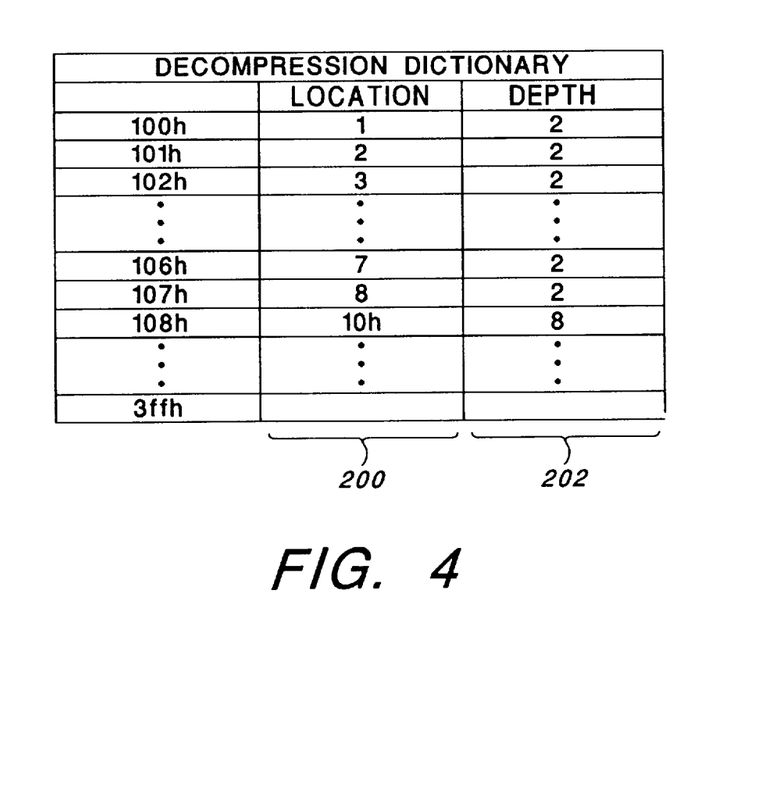
FIG. 4 is a tabular representation of exemplary compressed data generated by the data compression system of FIG. 1 in response to the input data of FIG. 3.

The decompression dictionary 24 structure is different than that of the compression dictionary 20 and is defined according to the following elements illustrated in FIG. 4:

LOCATION POINTER (200)—A pointer, into a previously decompressed area of the output data stream that points to a last character of a string of characters defined by a code word and a decompression dictionary entry. There are 768 such pointers, for code words 256 through 1023.

DEPTH (202)—A word that contains a number of characters in a string, the last of which characters is at the location in the previously decompressed area of the output data stream pointed to by the location pointer, defined by a code word and a dictionary entry. The decompressor subtracts the depth minus one from the location pointer to determine the first character of the string defined by the code word being processed. There are 768 such words, for code words 256 through 1023.

The decompression dictionary requires no initialization.

Code words are assigned in increasing sequential numerical order starting with 256, or 100 hexadecimal (h), and ending with 1023, or 3FFh. Code words 0, or 0h, through 255, or FFh, are reserved for the 256 possible hexadecimal representations of an 8 bit byte.

Figure 5:
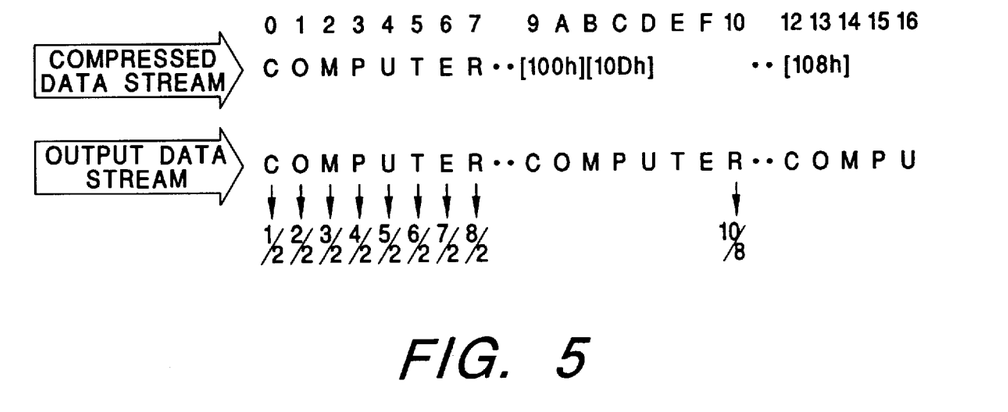
FIG. 5 is a tabular representation of a decompression dictionary generated by the data compression system of FIG. 1.

Referring to FIG. 5, an illustration is shown of an exemplary compressed data stream generated by the compressor 18 in response to the input data stream of FIG. 4.

Figure 6A:
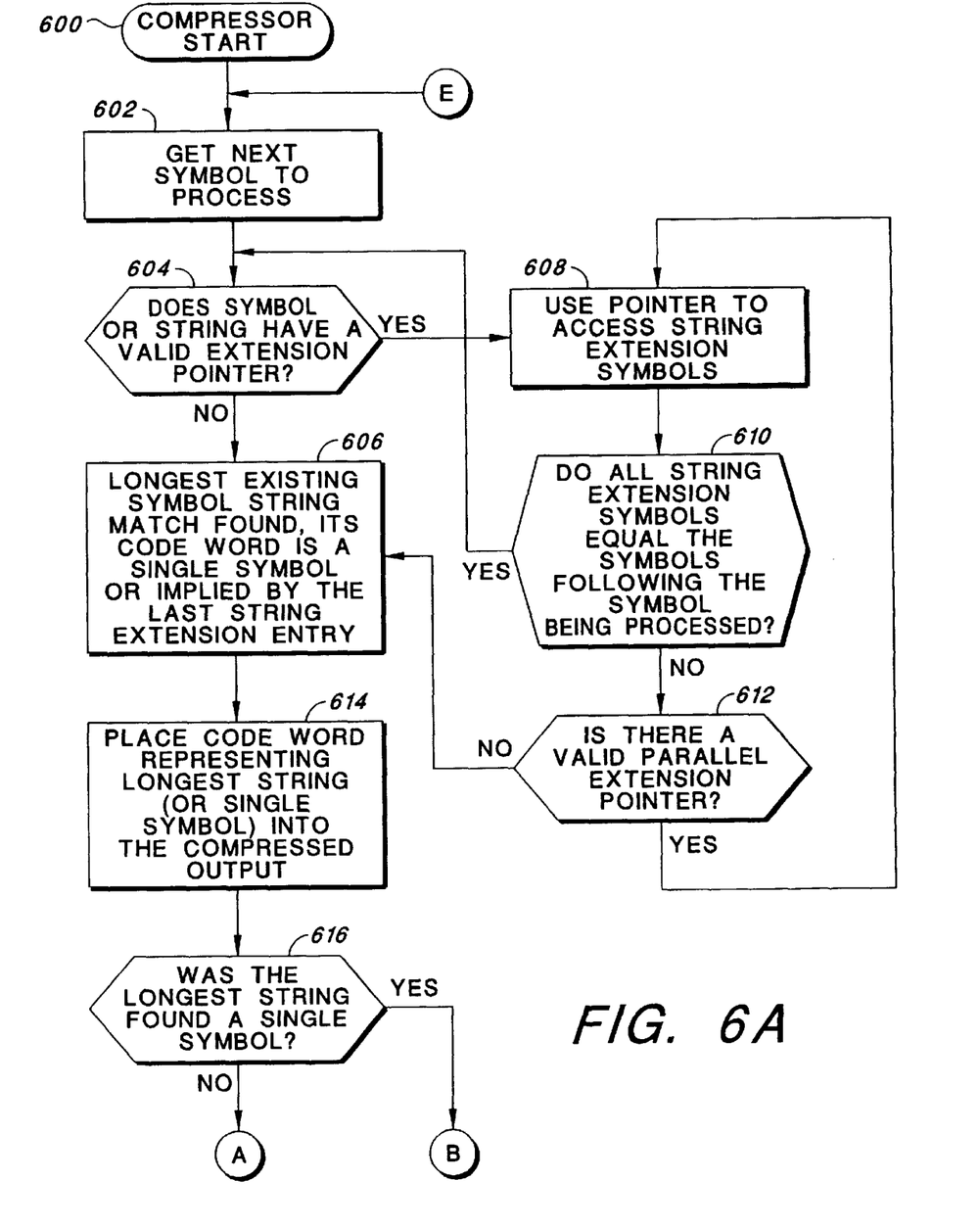
FIGS. 6A, 6B and 6C are is flow charts illustrating steps traversed by the data compression system of FIG. 1 in order to compress an input data stream.
Figure 6B:
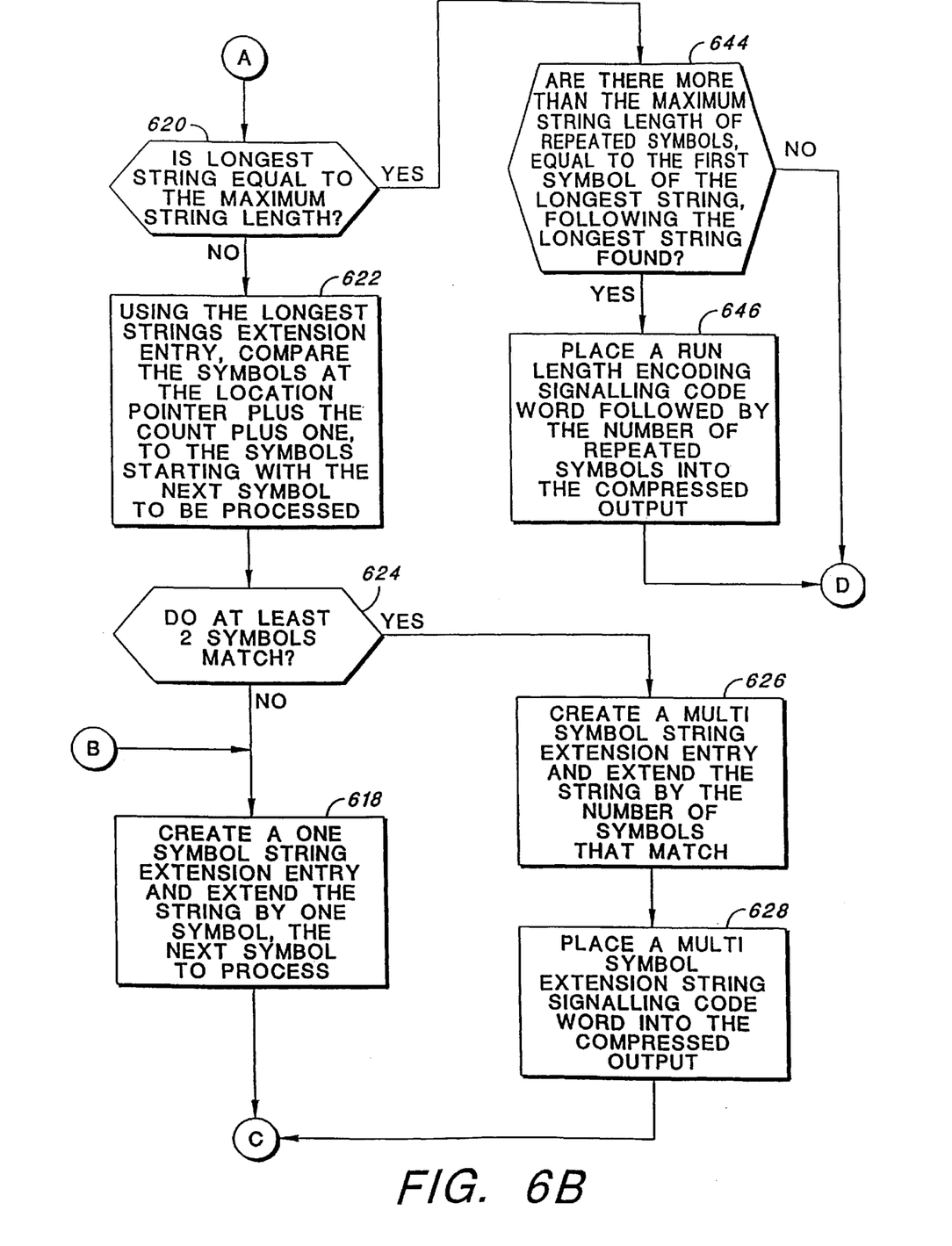
Figure 6C:
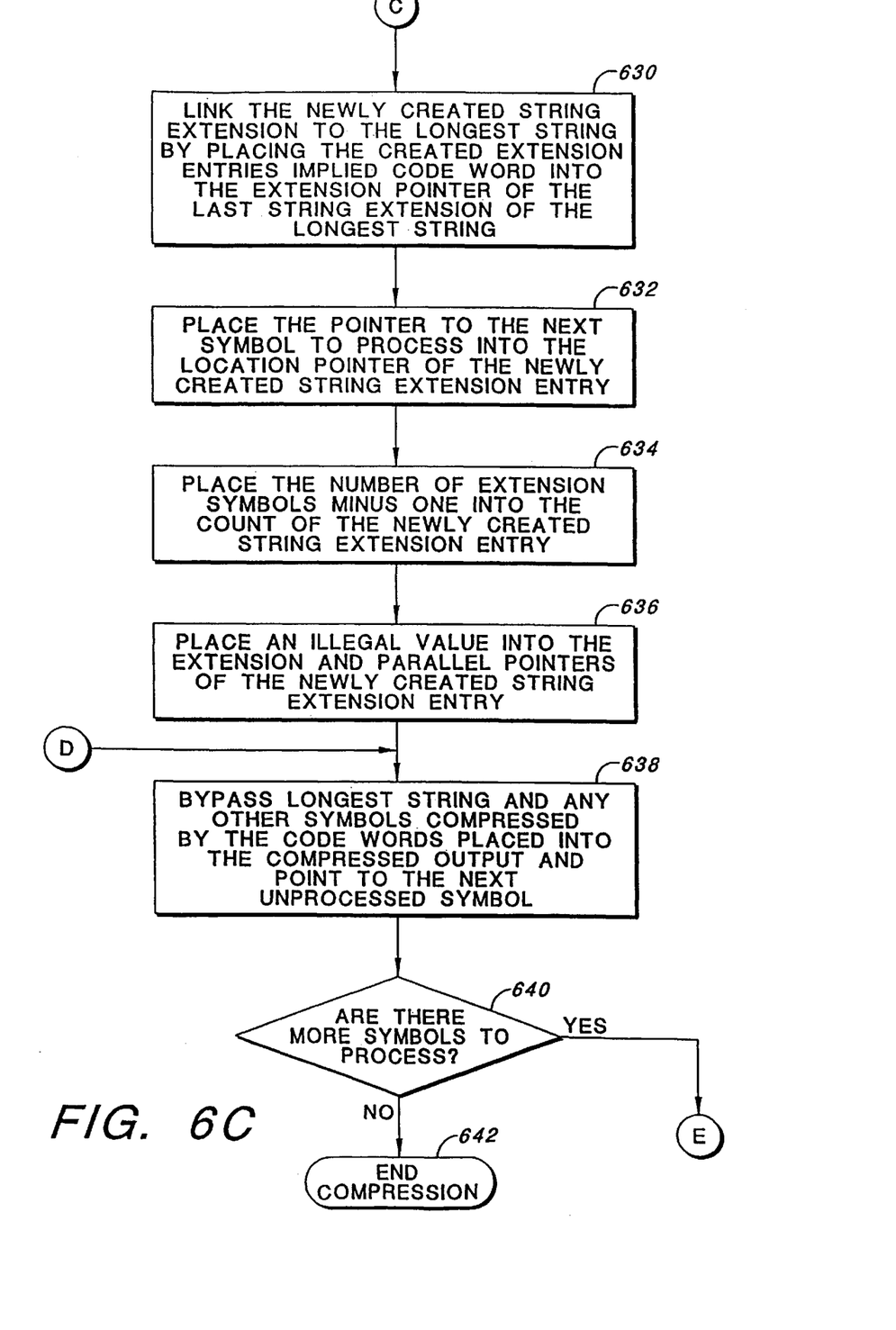

Referring to FIGS. 6A, 6B and 6C, a flowchart is shown of steps traversed by one variation of the compressor during a compression operation. The compressor starts (Block 600) with a first symbol or character in the input data stream, making a single pass through the input data stream, processing one or more symbols at a time (Block 602), and building the compression dictionary with the individual symbols and repeated strings of symbols it encounters, as follows:

1. The compressor 18 finds a longest previously encountered string of symbols that matches a string of symbols that starts with a symbol currently being processed as follows:
    1. The compressor 18 determines (Block 604) if the character being processed has been encountered previously in the data stream, by using the hexadecimal value of the symbol as an index into the compression dictionary to check the value of its entry's EXTENSION POINTER (100) (string extension entry).
    2. If the extension pointer 100 has an illegal value (Block 606), the symbol has not been encountered previously and the longest existing string match is found, a single symbol.
    3. If the EXTENSION POINTER (100) has a legal value (Block 608), the symbol has been encountered previously and points to a string extension entry that defines additional string symbols for comparison.
    4. Using the EXTENSION POINTER (100) to access the string extension's dictionary entry, the compressor determines (Block 610) if the symbols defined by the string extension's dictionary entry are equal to the symbols following the symbol being processed. The first symbol defined by the string extension's dictionary entry is pointed to in the input data stream by the dictionary entry's location pointer, and the number of symbols in the dictionary entry is the dictionary entry's count plus one.
    5. If all symbols defined by the string extension's dictionary entry are equal to the symbols following the symbol being processed (Block 610), processing continues (Block 604) with step 3 above. All such equal symbols are bypassed to get to a next symbol to be processed.
    6. If all the symbols defined by the dictionary entry are equal to the symbols following the symbol being processed (Block 610), and the extension pointer (100) of the string extension's dictionary entry is an illegal value (Block 604), the longest string match has been found (Block 606). The longest string match is a string of symbols that is represented by the code word assigned to the dictionary entry defining the entry for which all symbols represented match the symbols following the symbol being processed in the input data stream.
    7. If not all the symbols defined by the string extension's dictionary entry are equal to the symbols following the symbol being processed (Block 610), the dictionary entry's parallel pointer (102) is checked (Block 612) to determine if there is another dictionary entry that starts with the same symbols (Block 608 and 610), and thus has the same string extension.
    8. If the parallel pointer (102) is an illegal value (Block 612), the longest string match has been found (Block 606), which is represented by the previous string extension's code word. If the previous string extension is the symbol being processed, the longest string match found is a single symbol.

9. If the parallel pointer (102) is a legal value (Block 612), the compressor uses it to access (Block 608) the parallel string's dictionary entry. The compressor determines if the symbols defined by the parallel string's location pointer and count are equal to the symbols following the symbol being processed (Block 610). The steps starting at step 5, above, are then repeated.

2. The compressor then places (Block 614) a code word representing the longest string match into a compressed data stream, which is output by the compressor. The code words are shifted and packed into the compressed data stream as the longest string matches are determined.
3. The compressor then extends the longest string match by as many symbols as possible as follows:
    1. If the longest string match is a single symbol (Block, 616), that string is extended by one symbol (Block 618) by linking the next symbol to process as a one symbol string extension to the longest string match, i.e., the single symbol.
    2. If the longest string match is a multiple symbol string (Block 616), and is not already at a maximum string length (Block 620), the compressor attempts to extend that longest string match by as many symbols as possible (Block 622). Using the location pointer (104) of the last string extension entry of the longest string match, the dictionary entry defined by the code word for the longest string match placed into the compressed data stream, the compressor determines how many symbols following the last symbol of the longest string match are equal to the next symbols in the input data block stream.
    3. The compressor then compares (Block 622) the symbols pointed to by adding the location pointer (104) to the count (106) plus one, for the dictionary entry of the code word placed into the compressed data stream, to symbols starting with a next symbol in the input data stream to be processed.
    4. If one or no symbols match (Block 624), the longest string match is extended by one symbol by linking (Block 618) the next symbol to process as a one symbol extension to the longest string match.
    5. If two or more characters match (Block 624), the compressor extends the longest string match by as many symbols as match (Block 626), and places (Block 628) an extended string signaling code word into the compressed data stream. The extended string signaling code word indicates the number of symbols by which the longest string match is to be extended. The signaling code word is a code word that is greater than a last code word, i.e., last dictionary entry, built by an increment that equals the number of symbols by which the longest string match is to be extended.
4. The compressor builds a string extension to the longest string match by using the next sequential unbuilt dictionary entry, i.e., next unbuilt code word entry, as follows:
    1. Linking the string extension to the longest string (Block 630) by placing a code word implied by a relative position of a new string extension entry into the EXTENSION pointer (100) of the last string extension of the longest string.
    2. Placing a pointer to a next symbol to process in the data block into the LOCATION pointer (104) (Block 632). This points to a first symbol of the string extension.
    3. Placing the number of extension symbols minus one into the COUNT (106) (Block 634).
    4. Placing an illegal pointer value into the EXTENSION POINTER (100) and the PARALLEL pointer (102) (Block 636).
    5. If the string was extended by multiple symbols, bypass (Block 638) those symbols (i.e., the longest string and any other characters compressed) to get to the next symbol to process.
    6. Start over again (Block 640) with the next symbol to process, if there is such a symbol, trying to find the longest string or, if there are no more symbols to process, terminating the compressor (Block 642).

The mechanism described above to extend the longest string found is applicable for extending strings by many symbols, not just one symbol at a time. Each code word skipped by an extended string signaling code word indicates an additional character by which the previous string of symbols is extended. The extended string signaling code word can represent as many characters as there are code words yet to be built. For example, if the last code word built is 205h, a string can be extended by 20 (decimal) characters by sending an extended string signaling code word of 219h (20 decimal is 14h and 205h plus 14h is 219h). The extended string signaling code word, at the time the extended string signaling code word is used, is just that, a signal, the dictionary entry for the extended string signaling code word, at the time the extended string signalling code word is used, is not actually built yet by either the compressor or the decompressor. The next unused dictionary entry, following the last used dictionary entry, is used to build the multiple symbol string extension of the previous code word's string, the string extension implied by the extended string signaling code word. Once built, this dictionary entry is used in lieu of the extended string signalling code word, thus making usage of any given extended string signalling code word for a given string of symbols a one-time occurrence.

In the present embodiment, extended string signaling is limited by 9 to 10 bit, etc. code word boundaries. Thus, if the last code word built is 1F1h the extended string limit is 14 characters because the last 9 bit code word is 1FFh. 9 bit code words are used in the compressed output until the last 9 bit code word is built, and thus a 10 bit signaling code word is not used to extend a string until code word 1FFh is built. In other embodiments, extended string signalling is not limited by 9 to 10 bit, etc. code word boundaries.

The decompressor builds its dictionary using the characters and code words output by the compressor after they are received over the data channel 14. In accordance with the present embodiment, the dictionary entries and code words must reflect the same information that the compressor 18 used when building the compression dictionary 20 and they both should keep pace with one another.

A major difference between the compression dictionary 20 built by the compressor 18 and the decompression dictionary 24 built by the decompressor 22 is that the entries in the compression dictionary 20 are built by the compressor 18 for an extension string when the compressor 18 finds and processes the current longest string. However, the decompressor 22 must wait until it gets the next code word to extend the symbol string represented by the current code word.

The decompression dictionary 24 only contains string extension code words, i.e., those code words from 100h through 3FFh. The decompression code words are implied from the relative position of their corresponding dictionary entries within the decompression dictionary 24. However, since the first entry in the decompression dictionary 24 is code word 100h, the implied code word is the relative position of the entry in the dictionary offset by 100h.

Figure 7A:
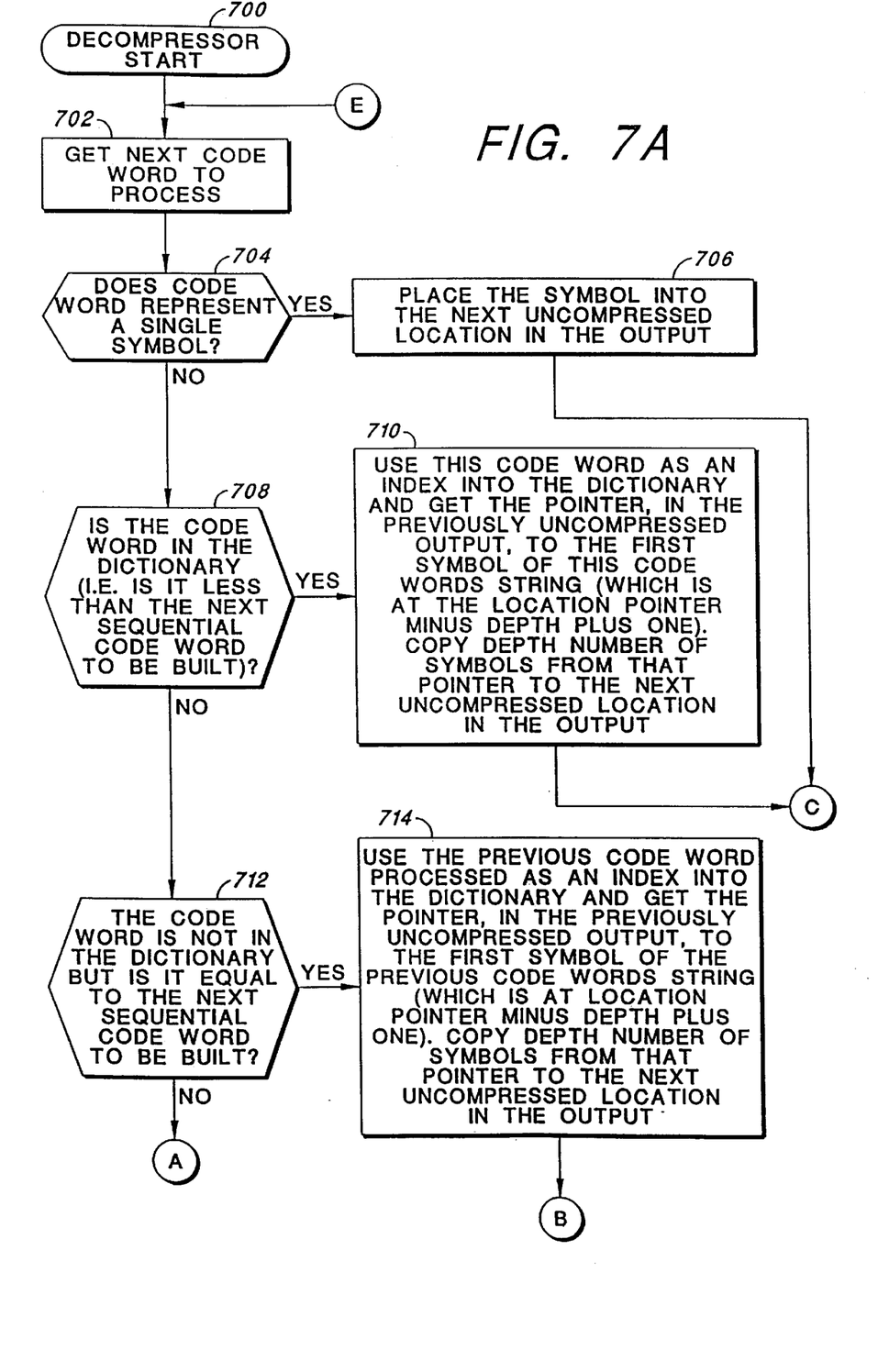
FIGS. 7A, 7B and 7C are flow charts illustrating steps traversed by the data compression system of FIG. 1 in order to decompress a compressed data stream.
Figure 7B:
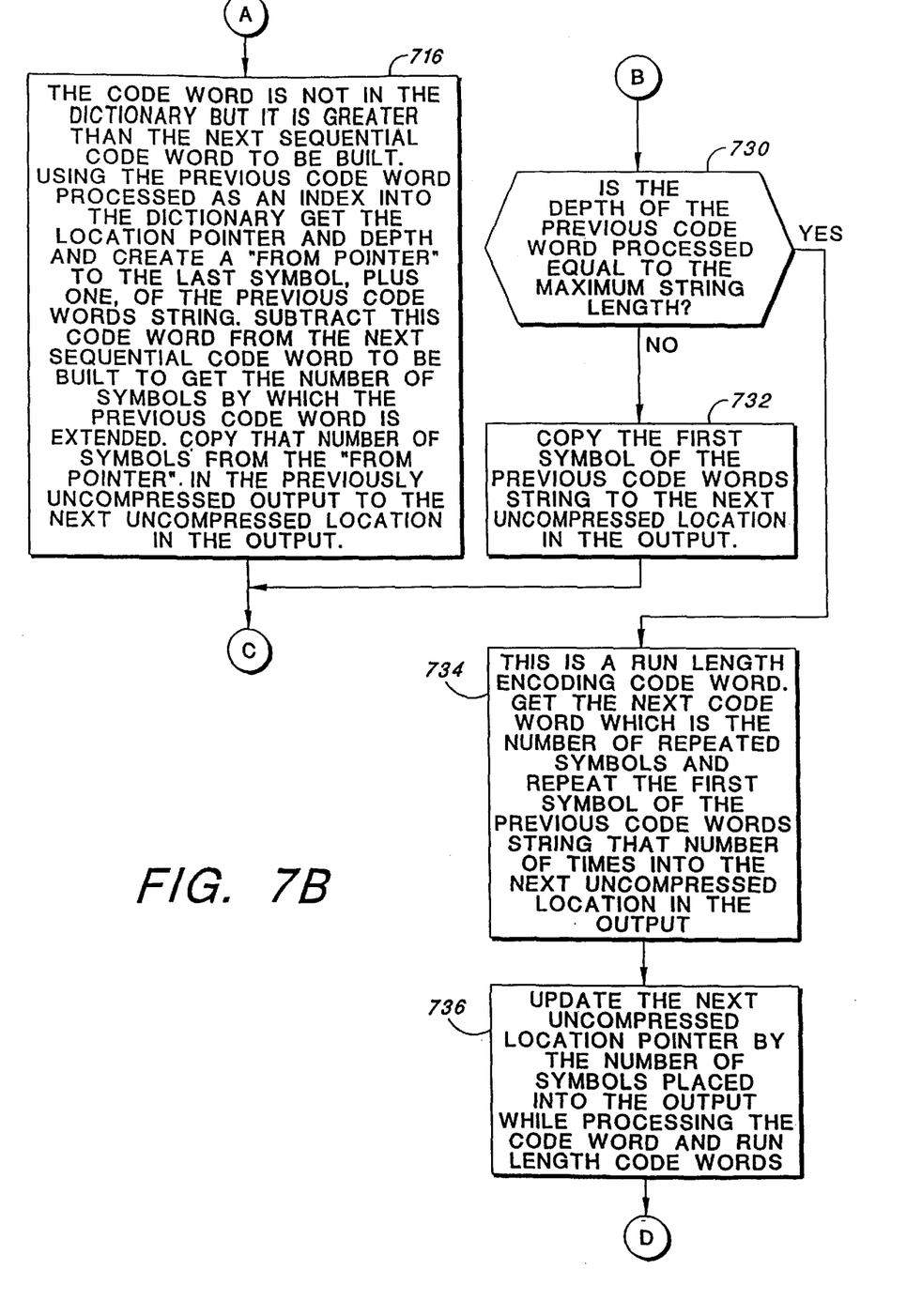
Figure 7C:
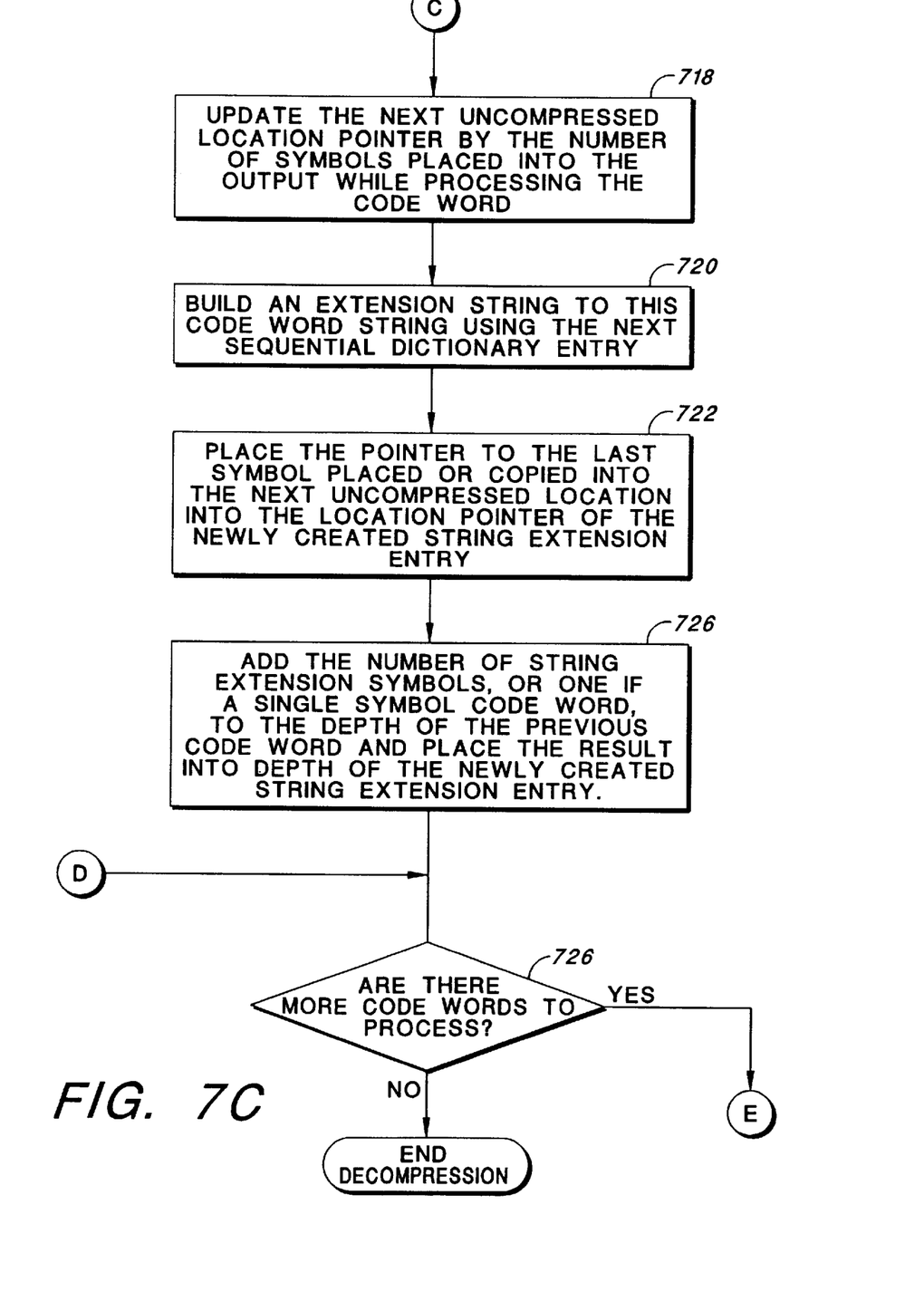

Referring to FIG'S. 7A, 7B and 7C, a flowchart is shown of steps traversed by one variation of the decompressor. The decompressor starts (Block 700) with a first code word of the compressed data block, making a single pass, and processes the code words one at a time (Block 702), as follows:

1. The decompressor determines (Block 704) if the code word represents a single symbol (i.e., less than 100h) and if so, places the symbol directly into the uncompressed data, i.e., output data stream, at a next available location (Block 706). The decompressor maintains a pointer to the location within the output data stream at which the next uncompressed symbol, or string of symbols, generated by the decompressor is to be placed.

2. If the code word does not represent a single character (Block 704), but a string of symbols, the decompressor does one of the following depending upon the code word.

1. If the code word is less than the next sequential code word to be built, i.e., its entry is in the decompression dictionary (Block 708), the decompressor uses the code word as an index into the decompression dictionary to find the LOCATION POINTER (200) and DEPTH (202) of the string defined by the code word (Block 710). The decompressor copies the string of symbols defined by the code word to the next location in the output data stream 16.

2. If the code word is equal to the next sequential code word to be built, i.e., the dictionary entry that will be built extending the previous string (Blocks 708 and 712). The previous code word is used as an index into the decompression dictionary. The previous code word's LOCATION POINTER (200) and DEPTH (202) are used to copy its string to the next uncompressed location (Block 714) in the output data stream. Then, the first character of the previous code word's string is placed into the next uncompressed location.

3. If the code word is greater than the next sequential code word to be built, i.e., an extended string signaling code word (Block 712), then the previous code word is used as an index into the dictionary (Block 716). The extended string signaling code word is subtracted from the last code word built to obtain the number of symbols to extend the previous string. The previous code word's LOCATION POINTER (200), pointing to the last symbol of its string, plus one, is the first of the extended symbols that are copied to the next location within the output data stream.

3. The decompressor then updates (Block 718) the next location in the uncompressed data pointer by the number of symbols placed into the output data stream during the processing of the code word.

4. The decompressor builds (Block 720) an extension string to the string represented by the previous code word by using the next sequential dictionary entry, following the last code word entry built, as follows:

1. Sets (Block 722) the LOCATION POINTER (200) to the last character placed or copied into the uncompressed data. The symbol identified by the LOCATION POINTER (200) is the symbol preceding the next uncompressed location pointer 200, updated in step 3, above.

2. Adds (Block 724) the number of string extension symbols, which is one, unless the extension string is an extended string (i.e., as signaled by an extended string signaling code word), to the DEPTH (202) of the previous code word and places the result into DEPTH (202).

5. Starts over again with the next code word (Block 726) in the compressed data stream to process.

In this way, the present data compression system compresses and decompresses data so as to make more optimal use of available processing, time, storage space and bandwidth resources.

EXAMPLE 1

Using, as an example data block, the string "COMPUTER", repeated 8 times in a data block with at least one intervening character between repetitions, the present approach builds 9 code words, extension strings, and dictionary entries when compressing or decompressing. For ease of understanding, intervening characters are not included in the example or figures. Dictionary entries 1 through 8, i.e., 100h through 107h are built the 1st time the string is encountered, but the 2nd time a string extension entry that extends dictionary entry 1 by 6 characters is built, i.e., 108h, whose code word represents all 8 characters, i.e., the first dictionary entry, which represents "CO" extended by six additional characters, "MPUTER". As a result, the compression ratio is improved by assigning a code word that represents a complete string the 2nd time it is encountered. This differs from the prior approach, for example, of U.S. Pat. No. 4,558,302 (Welch, et al.) in which a string is extended by only one symbol each time it is encountered. The present approach builds the code words, string extensions, and string table entries shown in FIGS. 2 and 3 while compressing the example data block and builds the code words shown in FIGS. 4 and 5 while decompressing the example data block.

In contrast to the earlier approach described in the '302 patent, the present approach generates the following compressed output in response to the first 8 occurrences of the word "COMPUTER" in the example data block:

| 1st Time | 2nd Time | 3rd Time | 4th Time | 5th Time |
|----------|----------|----------|----------|----------|
| COMPUTER | 100h 10Dh | 108h | 108h | 108h |
| 6th Time | 7th Time | 8th Time | | |
| 108h | 108h | 108h | | |

Note that the 10Dh output on the 2nd occurrence indicates an extended string signaling code word. The last dictionary entry built at that point was code word 107h, thus a 10Dh extends the previous code word's string by 6 characters. At the same time an entry for code word 108h is built representing the 6 character extension string. An exemplary compression dictionary built in accordance with the present example is shown in FIG. 2. An exemplary input data stream and an exemplary compressed data stream in accordance with the present example are shown in FIGS. 3 and 5. An exemplary decompression dictionary built in accordance with the present example is shown in FIG. 4. Note that when the decompressor receives code word 100h, it copies the two symbols from location 0 to the next uncompressed location, which at that time is location 9. Further note that when it next receives the code word 10Dh, which is not in the dictionary and is not the next code word to be built, it determines an extension length of 6. The decompressor then uses the next location in the output data stream, past the end of the previous code word received, i.e., location 2, which is past the end of the dictionary entry for code word 100h, and copies six symbols from location 2h to the next uncompressed location which is now location Bh. It then creates a dictionary entry for the extended code word, code word 108h, by adding the extension length of 6 to the length of the previous code word received, i.e., 2, for a depth of 8, and places a pointer to the symbol copied into location 10h.

In this example, the present approach reduces the number of string extension table entries and code words built from 22 (in accordance with the approach taken in the '302 patent) to 9 (in accordance with the present approach). In addition, the present approach reduces the compressed output from 26 code words (in accordance with the approach taken in the '302 patent) to 16 code words (in accordance with the present approach). Thus, the present approach represents a substantial improvement over the prior art.

In accordance with particular features of a variation of the present embodiment, sequential repeating patterns are compressed very efficiently by the present embodiment. (Blocks 620, 644 of FIG. 6B) This is true for a single symbol sequential repeating pattern, such as a string of 30 "A" characters, or a multiple symbol sequential repeating pattern such as "ABCABCABCABCABCABC". After a first iteration of the repeating pattern is processed it can be extended to its maximum useful length with two additional code words using the extended string mechanism described herein. The sequential repeating patterns are processed in the normal way by extending the string. For the string of 30 A characters, when the second and third A's are compressed using the code word of 100h, the character following the dictionary entry (100h), which is the third A, is compared to the next character to compress, the forth A, and the next 27 characters are equal since it is an overlapping sequence. Thus, the 100h dictionary entry is extended by 27 additional characters by placing a string extension signalling code word (11Bh) into the compressed output. The decompressor places the second and third A's when decompressing the 100h code word and when decompressing the 11Bh code word, copies the character following the 100h dictionary entry string, which is the third A, to fourth, then the fourth A to fifth, fifth to sixth, sixth to seventh, etc. 27 times, one character at a time, to recreate the string. For the pattern ABCABCABCABCABCABC, when the second occurrence of AB is compressed using its code word of 100h, the character following the dictionary entry (100h), which is the first C, is compared to the next character to compress, the second C, and all characters will be equal since it is an overlapping sequence, thus the string is extended by the length of the pattern minus five. The present embodiment can represent the above single character sequential repeating pattern (30 "A" characters) with three code words and the multiple character sequential repeating pattern ("ABCABCABCABCABCABC") with five code words. The decompressor 22 automatically handles sequential repeating patterns, without special accommodations.

An additional feature of the present approach requires that strings are allowed to be extended to a string length maximum of 30 characters, a maximum which is a configuration option and easily modified in accordance with particular design choices. To complement a string length maximum, whatever its value, a run length encoding method can be used in accordance with variations of the present embodiment to compress long strings of a single repeated symbol. (Blocks 644 and 646 of FIG. 6B) When the compressor finds a longest string that is also a string length maximum, it outputs its code word and determines how many additional repeated symbols there are before a different symbol is encountered. If there are more than the string length maximum of additional repeated symbols the compressor outputs a run length signaling code word equal to the next code word to be built. The run length signaling code word is followed by the number of additional repetitions of the symbol. Neither the compressor nor the decompressor actually build a string extension entry at the next code word when the present run length encoding method is employed, but merely "borrow" the next code to be built as the run length signaling code word. The decompressor 22 handles run length signally code words as illustrated in FIG. 7B, in Blocks 730, 734 and 736.

EXAMPLE II

By combining run length encoding with multiple symbol string extension, the present approach can represent a very long single symbol sequential repeating pattern with 5 code words. For example, if a data block starts with 500 duplicated "A" symbols (a 41h in ASCII), the present approach generates a compressed output consisting of the code words 41h, 100h, 11Ch, 102h, 1B6h. These code words represent 1, 2, 28, 31 and 438 "A"s respectively. In the process, the compressor builds only two code words and string extension dictionary entries, i.e., for 100h, which extends "A" by one additional character and for 101h, which extends 100h by 28 additional characters, 11CH is an extended string signaling code word (101h, which is the next available code word, plus 28 additional symbols), 102h (which is then the next available code word) is a run length signaling code word, 1B6h indicates the run length.

Thus, in accordance with the embodiments disclosed herein, a vast improvement over conventional and heretofore known data compressions systems is abandoned, both in terms of compressor efficiency and compression speed.

While the invention herein disclosed has been described by means of specific embodiments and applications thereof, numerous modifications and variations could be made thereto by those skilled in the art without departing from the scope of the invention set forth in the claims.

What is claimed is:

1. A method of compressing data for transmission over a communications channel comprising:

receiving a symbol, and at least one subsequent symbol;

determining in a compression dictionary whether the symbol has a valid extension pointer;

using, in the event the symbol does have a valid extension pointer, the valid extension pointer to access string extension symbols;

determining, in the event the symbol does have a valid extension pointer, whether the string extension symbols equal the at least one subsequent symbol;

determining in the compression dictionary, in the event the string extension symbols do not equal the at least one subsequent symbol, whether the symbol has a valid parallel extension;

repeating, in the event the symbol has a valid parallel extension, the using step;

repeating, in the event the string extension symbols equal the at least one subsequent symbol, the determining of whether the symbol has a valid extension pointer;

inserting, in the event the symbol does not have a valid extension pointer or in the event the symbol does not have a valid parallel extension, a code word indicative of a longest string found into a compressed data stream;

determining whether the longest string was a single symbol;

extending, in the event the longest string was a single symbol, the longest string by one symbol;

extending, in the event the longest string was not a single symbol, the longest string by a plurality of symbols;

placing, in the event the longest string was not a single symbol, and in the event the longest string is extended by more than one symbol, a multi-character extension string signaling code word into the compressed data stream; and transmitting the compressed data stream through the communications channel.

2. The method of claim 1 further comprising:

determining whether said longest string is longer than a maximum string length;

placing, in the event the longest string is longer than a maximum string length of a repeated symbol, a run length encoding signaling code word into said compressed data stream.

3. The method of claim 1 further comprising:

linking a new extension string to the longest string by:
  placing a code word associated with the new extension string in an extension pointer of the dictionary entry associated with the longest string;
  placing a count indicative of a number of symbols in the new extension string into a new dictionary entry for the new extension string; and
  placing a location pointer to a first symbol of the new extension string into the new dictionary entry for the new extension string.

4. A method for decompressing data received over a communications channel comprising:

receiving a code word;

determining whether the code word represents a single character;

placing, in the event the code word represents a single character, the code word into an output data stream;

determining, in the event the code word represents more than a single character, whether the code word is in a dictionary;

placing, in the event the code word is in the dictionary, a string defined by the code word into the output data stream;

determining, in the event the code word is not in the dictionary, whether the code word is a next code word to be built;

placing, in the event the code word is a next code word to be built, a string into the output data stream, the string being copied from a dictionary entry indicated by a previous code word processed;

placing, in the event the code word is the next code word to be built, a first symbol of the string into the output data stream; and placing, in the event the code word is not in the dictionary and is not the next code word to be built, an extension string into the output data stream, the extension string being copied from the output data stream at a symbol following a last symbol of a dictionary entry indicated by a previous code word processed.

5. The method of claim 4 further comprising:

determining whether the previous code word processed is of a maximum string length;

placing, in the event the code word is not in the dictionary and the previous code word processed is of the maximum string length, a run length string into the output data stream, the run length string comprising a first symbol of the previous code word processed repeated a number of times indicated by a next code word to be processed.

* * * * *